United States Patent [19]
Crane

[11] 4,012,093
[45] Mar. 15, 1977

[54] CONNECTOR ARRANGEMENT FOR THIN, DEFLECTABLE CONDUCTORS

[75] Inventor: Merlin L. Crane, Banning

[73] Assignee: The Deutsch Company Electronic Components Division, Banning, Calif.

[22] Filed: Aug. 25, 1971

[21] Appl. No.: 174,696

[52] U.S. Cl. .......................... 339/17 F; 339/94 M; 339/97 R; 339/18 R; 339/176 MF; 339/276 T; 361/398

[51] Int. Cl.² ........................................ H05K 1/02

[58] Field of Search ............ 339/17 F, 17 M, 273 R, 339/273 F, 247, 221, 91 R, 91 A, 91 M, 223, 95 D, 95 A, 176 R, 176 M, 176 MF, 92 M, 277 R, 276 R, 276 T, 276 F, 210 R, 210 M, 214, 215, 211, 191–194, 195, 196; 317/101; 174/68.5

[56] References Cited

UNITED STATES PATENTS

| | | | |
|---|---|---|---|
| 2,174,081 | 9/1939 | Fitzsimmons | 339/97 P X |
| 2,499,296 | 2/1950 | Buchanan | 339/276 T X |
| 2,718,627 | 9/1955 | Swenson | 339/276 T |
| 2,815,494 | 12/1957 | Hutchings | 339/130 C X |
| 2,946,877 | 7/1960 | Nalette et al. | 339/17 F X |
| 3,130,921 | 4/1964 | Morgan | 339/99 L |
| 3,158,425 | 11/1964 | Pritulsky | 339/258 A |
| 3,168,617 | 2/1965 | Richter | 339/17 F |
| 3,213,404 | 10/1965 | Hedstrom | 339/97 P |
| 3,235,830 | 2/1966 | Newton, Jr. | 339/18 R |
| 3,365,694 | 1/1968 | Parker | 339/17 F |
| 3,372,361 | 3/1968 | Wengen | 339/97 R |
| 3,533,049 | 10/1970 | Thompson | 339/17 F X |
| 3,646,285 | 2/1972 | Farrell et al. | 200/61.08 X |
| 3,663,922 | 5/1972 | Foust, Jr. et al. | 339/17 F |

FOREIGN PATENTS OR APPLICATIONS

| | | | |
|---|---|---|---|
| 728,299 | 2/1966 | Canada | 339/94 M |
| 1,188,520 | 4/1970 | United Kingdom | 339/17 F |
| 1,142,160 | 2/1969 | United Kingdom | 339/17 M |

OTHER PUBLICATIONS

IBM Technical Disclosure Bulletin, vol. 5, No. 11, 4–1963, p. 47, "Flexible Laminated Tape Cable Connector," Horton; 339–17 F.

IBM Technical Disclosure Bulletin, vol. 6, No. 8, 1–1964, p. 87, "Circuit Board Connective Scheme," Roche et al., 339–18 R.

*Primary Examiner*—Roy D. Frazier
*Assistant Examiner*—Terrell P. Lewis
*Attorney, Agent, or Firm*—Gausewitz, Carr & Rothenberg

[57] ABSTRACT

An arrangement for forming an electrical connection to a thin, deflectable conductor, such as in a printed circuit tape, in which a pin is forced through an opening in the conductor to expand the opening to cause the conductor to overlie and bear against the surface of the pin, the conductor being held between dielectric members adjacent the pin to limit the part deflected. Adapters allow a single pin assembly to engage several tapes, while the pins may have ends that either directly engage conventional socket contacts or intermediate contacts which, in turn, mate with conventional contacts connected to wires.

16 Claims, 26 Drawing Figures

INVENTOR.
MERLIN L. CRANE
BY
ATTORNEY.

INVENTOR.
MERLIN L. CRANE

BY

ATTORNEY.

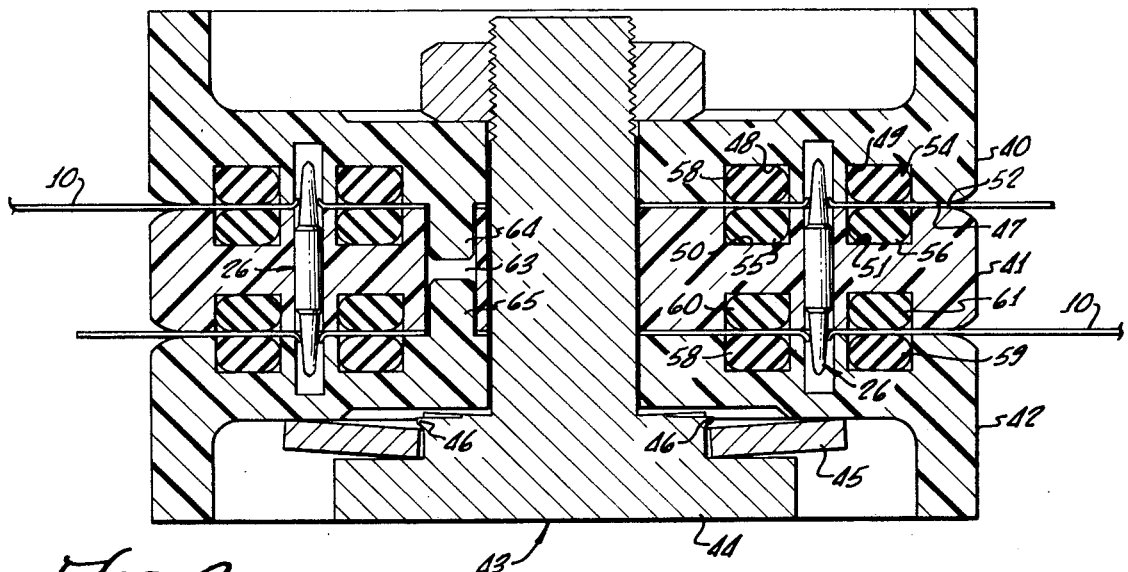
FIG. 9.
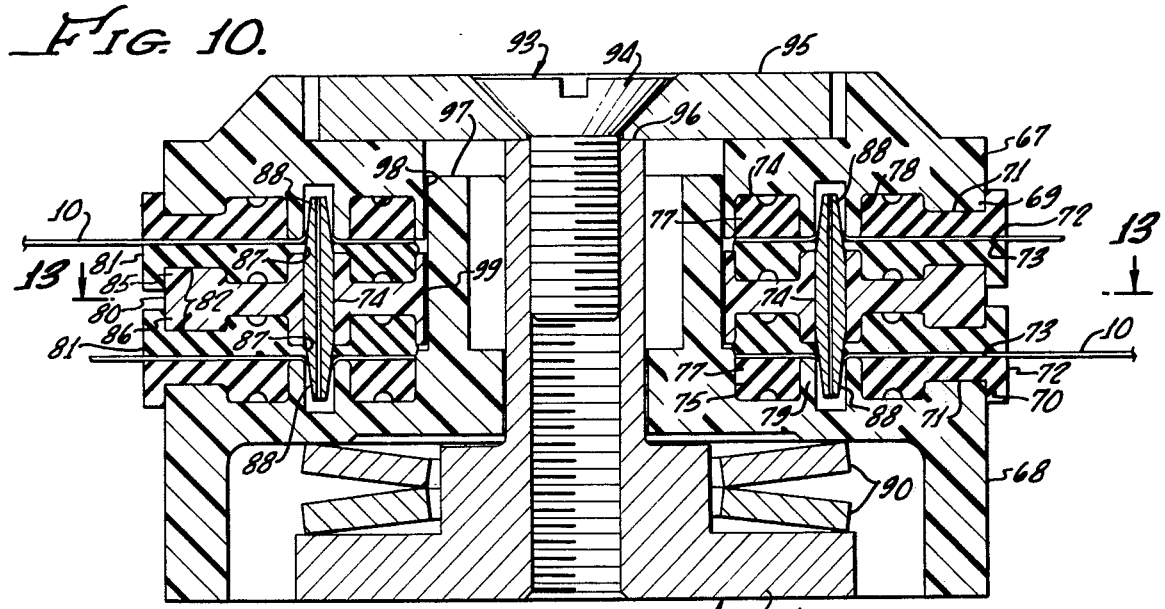
FIG. 10.
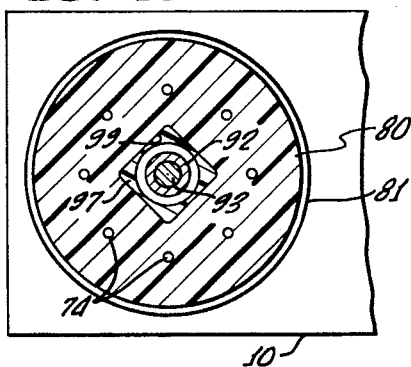
FIG. 13.
FIG. 11.
FIG. 12.
INVENTOR.
MERLIN L. CRANE
BY
ATTORNEY.

INVENTOR.
MERLIN L. CRANE
BY
ATTORNEY.

INVENTOR.
MERLIN L. CRANE

BY

ATTORNEY.

INVENTOR.
MERLIN L. CRANE

BY

ATTORNEY.

CONNECTOR ARRANGEMENT FOR THIN, DEFLECTABLE CONDUCTORS

BACKGROUND OF THE INVENTION

1. Field of the Invention

This invention relates to an electrical connector, particularly for making connections with relatively thin, deflectable conductors.

2. Description of the Prior Art

Printed circuit tape offers certain advantages in providing multiple conductors in electrical circuits. The tapes are thin and flexible, yet may have a high density of electrical conductors incorporated in them. There is assurance that the conductors are uniformly isolated from each other, and the tapes are light in weight and adapted to a wide variety of uses. Problems arise, however, in making electrical connections between such printed circuit tapes, or from a printed circuit tape to a terminal junction or conventional wires. The problems are more acute where performance requirements are especially rigid as in the aerospace field. Vibration loads, the presence of moisture and temperature extremes mean that electrical connections must be made securely and full protection afforded.

For some uses, spring-loaded devices are caused to bear on the conductors to accomplish the electrical connection. This is disadvantageous where size and weight are a problem or where vibrational loads may be encountered. Environmental sealing presents a further difficulty with these constructions. Other designs, such as in U.S. Pat. No. 3,150,909, clamp the conductors beneath screws. This is not adapted to effect multiple connections in small sizes, and the screws are subject to loosening under vibrational loads. Sealing offers a further problem. In U.S. Pat. No. 3,297,974, individual posts, rather than screws, engage the conductors. Nevertheless, some holding arrangement is required, and the problem of obtaining uniform clamping force arises where multiple conductors are employed. In U.S. Pat. No. 2,502,291, a cylindrical pin is extended through a lamination that includes a conductor and a plastic sheet, but requires heating after this to melt a layer of solder on the pin to obtain a fused joint. More conventionally, cylindrical pins are extended through openings in the conductors and individually soldered to form the connections. Obviously, this is a slow and costly procedure, made more difficult for small-sized parts. Wave soldering sometimes is used, but many parts are not adapted for this technique. Soldered joints must be melted to permit subsequent separation of the elements, so that disassembly becomes difficult. Irrespective of these shortcomings, for high-performance applications, it has been the practice to separately solder each pin to the conductor with which it is associated, despite the laborious nature of this procedure and the expense it entails.

SUMMARY OF THE INVENTION

The present invention provides a greatly improved and simplified way of making connections to printed circuit tapes or the like, providing a fully reliable connection that is rapidly and economically accomplished. The connection may be environmentally sealed and will withstand temperature extremes without failure. The connection is readily separated and the parts may be reconnected repeatedly without loss of performance. The connectors are light in weight and easily assembled without the use of special tools. There are no loose contacts to handle, which is particularly advantageous in smaller sizes.

In accomplishing the electrical connection, a tapered pin is forced into an opening in a thin, deflectable conductor, which may be carried by a laminated tape of dielectric material. As the tapered pin enters the opening in the conductor, it distorts the conductor at the opening outwardly toward the apical end of the tapered pin. As a result, the opening is expanded and the conductor exerts an inward force against the tapered pin to help accomplish an electrical connection. Also, there is area contact between the tapered pin and the conductor by virtue of the deflection of the conductor outwardly along the surface of the pin. In assuring the proper relationship between the pin and the conductor, the latter member is clamped on both sides closely adjacent the periphery of the opening through it, so that only a limited amount of material is exposed and subject to deflection by the tapered pin. Therefore, instead of bending a relatively large portion of the conductor, only a localized part is deflected and must assume a position where it is distorted by the pin and closely overlies the pin's surface.

An electrical coupling device may include a plurality of the tapered pins carried in a dielectric member. These are to engage corresponding conductors carried by a flexible tape. Another dielectric member is clamped against the first to hold the conductors around the openings through them. The clamping arrangement may include a means for applying a resilient force to the dielectric members in holding them together where the unit is to be subjected to temperature extremes. This allows the parts to expand and contract under temperature fluctuations without losing the clamping force holding the dielectric elements together. The resilient force may be accomplished by means of a bolt or screw engaging a Belleville washer. When the pins are in a circular pattern, annular seals may be positioned between the dielectric members both inside and outside the pins. This will prevent moisture from entering the area where the pins connect to the tapes.

The connector is versatile, allowing several printed circuit tapes to be connected together, or connections to be made to wires or other devices. The pins may have two tapered ends, engaging two tapes to form circuits between their conductors. In making connections to conventional wires, the tapered pins may have extensions that mate with additional contacts which, in turn, connect to wires. A stack of several tapes may be assembled with the pins having extensions of various lengths to permit connections to different tapes of the assembly. In order to assure proper connections despite tolerance buildups in the tape stack, the pins may connect to intermediate contacts which will allow substantial axial variations in the positions of the ends of the pin extensions. The intermediate contacts, in turn, mate with conventional socket contacts attached to wires. Intermediate socket contacts may be utilized when a group of tapes on one side of a bulkhead or the like is to be connected to a similar group of tapes on the opposite side of the bulkhead. Adapters may be incorporated with the pins to enable a single pin assembly to connect to several tapes arranged in a stack.

The technique of the present invention also may be used in making connections between other objects, such as connecting to a printed circuit board, without the use of solder. In this event, a thin, deflectable washer may be provided at the entrance to the opening in the conductor on the printed circuit board and a tapered pin forced into this washer. This will deflect the washer so that it will accomplish an electrical connection with the tapered pin in the same manner as it is accomplished with the conductor on the printed circuit tape. In addition, the washer is wedged into the opening in the conductor of the printed circuit board, and this completes an electrical circuit between the tapered pin and the printed circuit board conductor.

BRIEF DESCRIPTION OF THE DRAWINGS

FIG. 9 is a sectional view of a connector that includes seals to prevent the entry of moisture to the locations where the pins connect to the tapes;

FIG. 10 is a sectional view of a different embodiment of the connector;

FIG. 11 is an elevational view of the modified connector pin used in the connector of FIG. 10;

FIG. 12 is a transverse sectional view taken along line 12—12 of FIG. 11;

FIG. 13 is a sectional view taken along line 13—13 of FIG. 10;

DESCRIPTION OF THE PREFERRED EMBODIMENTS

Figure 1:
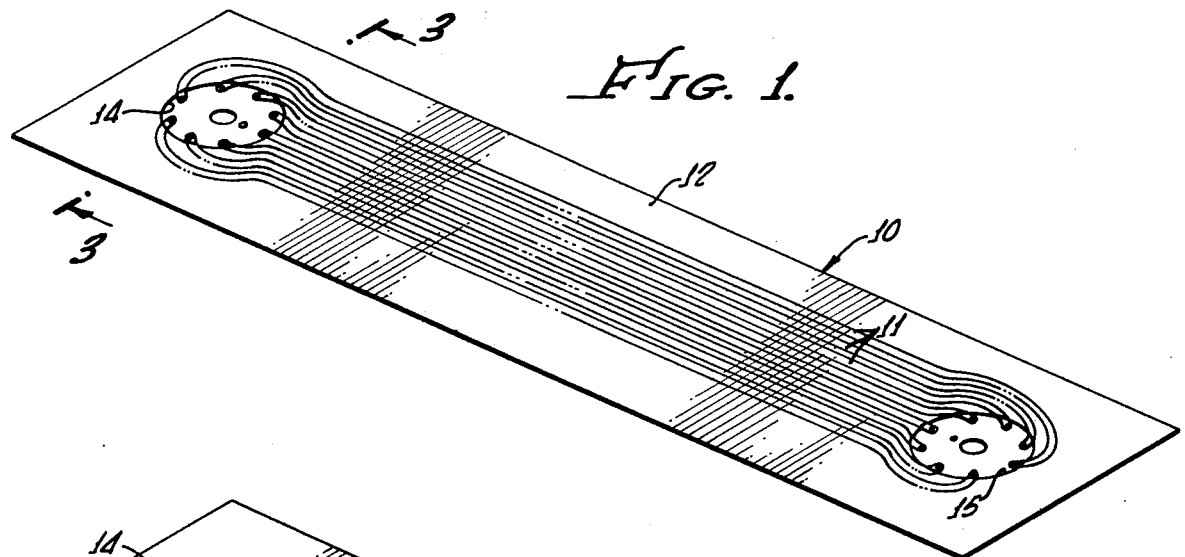
FIG. 1 is a perspective view of a printed circuit tape of a type used in conjunction with the present invention.
Figure 4:
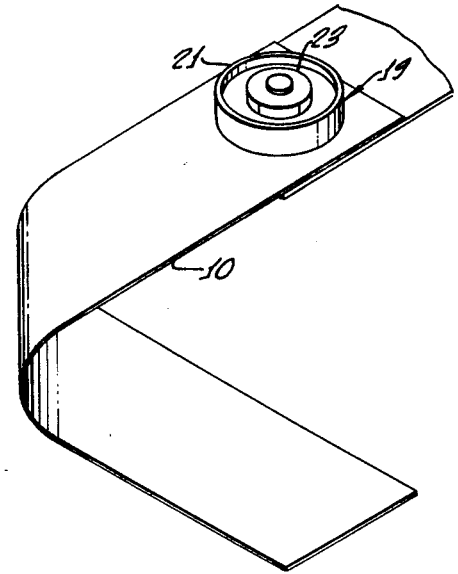
FIG. 4 is a perspective view showing the flexibility of the printed circuit tape.

The arrangement of the present invention is particularly adapted for forming terminal connections for printed circuit tapes, such as the tape 10 shown in FIG. 1. Typically, such tape includes a plurality of thin, flat conductors 11 of a suitable electrically conductive material, such as soft copper, laminated between layers 12 and 13 of a plastic sheet material. The tape is flexible and readily may be bent to a desired curvature, such as illustrated in FIG. 4. The layer 12 has circular cutouts 14 and 15 at its opposite ends, which expose the ends of the conductors 11 on one side of the laminated assembly 10. The ends of the conductors 11 are arranged in a generally circular pattern, each being provided with a small opening 16. The plastic sheet 13 is provided with a circular pattern of openings 17 which are aligned with and of the same diameter as the openings 16 in the conductors 11. A central opening 18 is at the axis of the pattern of the small openings 17 in the flat sheet 13.

Figure 5:
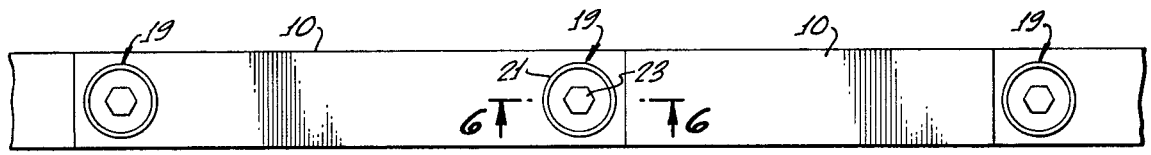
FIG. 5 is a top plan view of a plurality of tapes interconnected by the connector of this invention.
Figure 6:
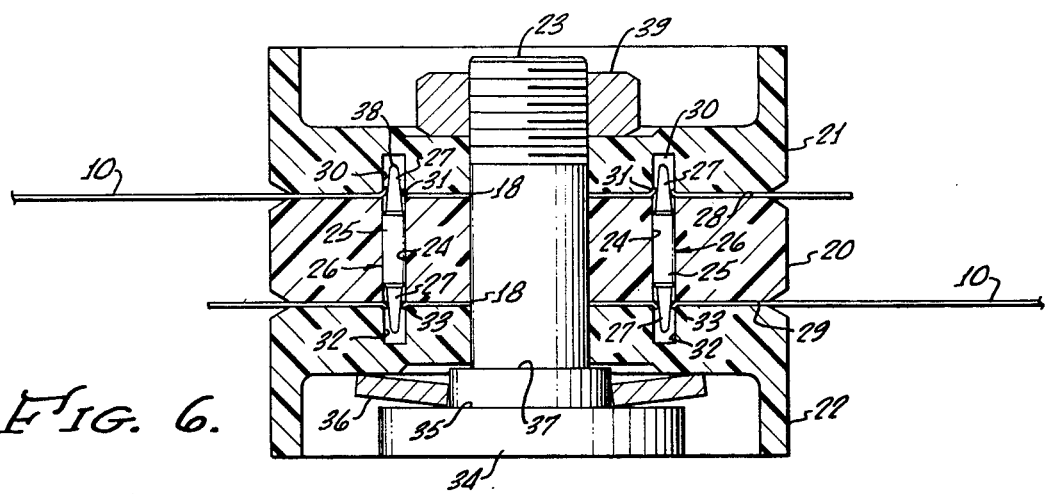
FIG. 6 is an enlarged sectional view taken along line 6—6 of FIG. 5.

FIG. 5 illustrates a plurality of the circuit tapes 10 interconnected by couplers 19 which provide both electrical and mechanical connections. Of course, the tapes may be made considerably longer than those illustrated. Each coupler 19 includes a central portion 20 and outer members 21 and 22, the assembly being held together by a bolt 23. The members 20, 21 and 22 are of a rigid dielectric material. Held within openings 24 in the central member 20, such as by a press fit, are the central cylindrical parts 25 of pins 26 which are arranged in the same pattern as the openings 16 and 17 in the conductors 11 and the plastic sheet 13, respectively. The opposite ends 27 of the pins 26 are frustoconical in configuration, having a shallow taper, and project outwardly beyond the radial end faces 28 and 29 of the member 20. Cylindrical openings 30 in the member 21, each having a frustoconical entrance portion 31, receive the ends 27 of the pins 26. Similar openings 32 with frustoconical entrances 33 are provided in the member 22.

The shank of the bolt 23 extends through central openings in the members 20, 21 and 22 as well as passing generally complementarily through the openings 18 in the sheet members 13 of the conductor laminations 10. The head 34 of the bolt 23 is provided with a radial shoulder 35, beneath which is a Belleville spring washer 36. Therefore, the bolt 23 and washer 36 provide a resilient compressive force on the assembled members 20, 21 and 22. An additional radial shoulder 37 on the bolt head can engage the outer surface of the member 21, preventing the Belleville washer 36 from being collapsed when the bolt 23 is tightened.

Figure 7:
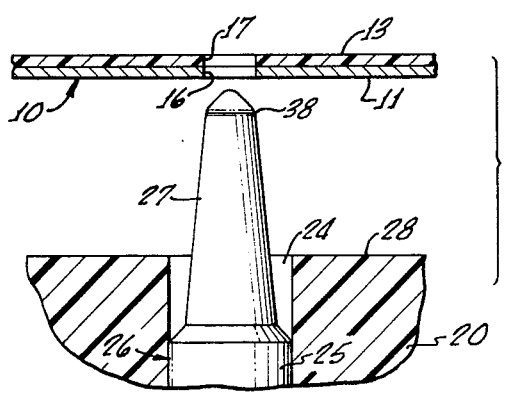
FIG. 7 is an enlarged fragmentary view showing the tape prior to assembly with the tapered pin of the connector.

Each coupler 19 interconncts two of the flexible tapes 10. In so doing, the pin ends 27 are extended through the openings 16 in the conductors 11 as well as the openings 17 in the flexible sheet 13. The tapes 10 are positioned so that the conductors 11 are adjacent the radial end surfaces 28 and 29 of the central member 20. Therefore, the conductors 11 are adjacent the bases of the tapered pin ends 27, and the sheets are adjacent the tips of the pin ends. The pin ends 27 are proportioned relative to the openings 16 and 17 such that the pins distort the conductors 11, bending them outwardly as the pins are advanced into the openings 16. In other words, the portions of the tapered ends 27 of the pins 26 adjacent the radial end surfaces 28 and 29 of the member 20 are substantially larger than the original dimensions of the openings 16 through the conductors 11. The outer ends 38 of the frustoconical portions 27 of the pins 26 are substantially the same diameter as the openings 16 prior to the assembly of the tapes and the pins (see FIG. 7). The outer tips of the pin ends are convergent to facilitate their entry into the openings 16.

Figure 8:
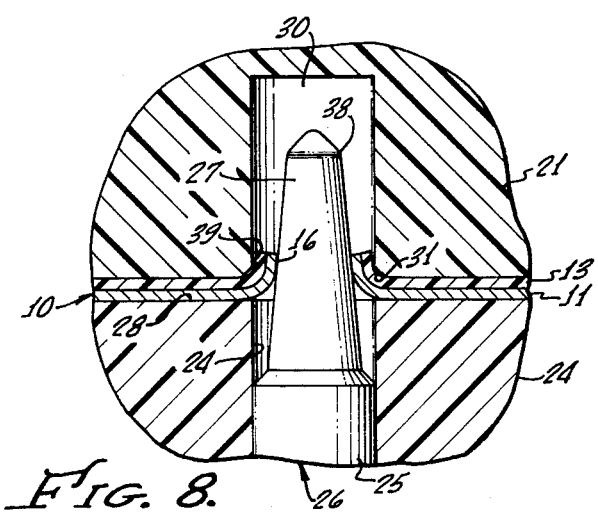
FIG. 8 is a view similar to FIG. 7 after assembly of the connector.

The conductors 11 are progressively deflected outwardly along the surfaces of the frustoconical portions 27 of the pins 26 as the tape is forced over the pins. As a result, as seen in FIG. 8, the conductors 11 bear tightly against the surfaces 27 of the pins 26 at the distorted and expanded openings 16. The material of the tape 10 is in hoop tension around the openings 16 so that there are inward forces urging the conductors 11 against the peripheries of the pin ends 27. In addition, by being distorted outwardly, the conductors 11 at the openings 16 have a substantial surface area in engagement with the pins. The undersurfaces of the conductors 11 at the distorted openings 16 overlie the tapered pin surfaces to provide the area contact. These combined effects mean that there is a good electrical connection between each pin 26 and the conductors 11 which it engages.

This deflection of the conductors 11 around the pins is assured by the support for the tape 10 immediately adjacent the openings 16 and 17. In other words, one of the tapes 10 is clamped between the members 20 and 21 and the other between the members 20 and 22. The outer end of the entrance portion 31 of the opening 30 in the member 21 is only slightly wider than the openings 16 and 17, so that only a narrow annular portion of the conductor 11 is free to bend as the pin end 27 enters the opening 16. This means that the conductor 11 is given a sharp bend by the pin and lies closely along the tapered surface of the pin. When the assembly is completed, the corner 39 between the flared entrance 31 and the cylindrical part of the opening 30 may engage the outer surface of the deflected part of the sheet 13 and help hold the conductor 11 around the pin. This engagement of the corner 39 is not mandatory and may not occur in some tolerance conditions, but adds to the force exerted by the conductor 11 on the pin end 27 when such engagement takes place. The openings 32 in the member 22 are similarly proportioned and the effect is the same for the other tape 10.

The spring force provided by the Belleville washer 36 means that the coupler 19 can withstand temperature variations without disturbing the positions of the pins 26 relative to the conductors 11. This, in turn, assures that the electrical continuity between the pins and the conductors is uninterrupted. Expansion and contraction of the parts in the axial direction are taken up by the Belleville washer 36, and there always is an adequate compressive force to hold the assembly of parts 20, 21 and 22 together.

The embodiment shown in FIG. 9 is basically the same as that previously described, but in addition, provides an environmental seal around the connections between the pins 26 and the conductors 11. Again, the coupler includes three members 40, 41 and 42 of dielectric material held together by an axial bolt 43 beneath the head 44 of which is a Belleville washer 45. The undersurface of the head 44 may be staked at spaced locations 46 to retain the washer 45 to the bolt 43 when the unit is disassembled. In the radial face 47 of the member 40 are two concentric annular grooves 48 and 49. Similar grooves 50 and 51 are formed in the radial face 52 of the inner dielectric member 41. O-rings 53 and 54 are received in the grooves 48 and 49, while opposing O-rings 55 and 56 are located in the grooves 50 and 51, respectively. The O-rings 53 and 54 bear against the top of the upper tape 10, as the device is shown in FIG. 9, forming a seal on the inside and outside of the pattern of pins 26. Similarly, the O-rings 55 and 56 bear on the undersurface of the upper tape 10 opposite from the O-rings 53 and 54 and seal the connections at the underside. The O-rings have a greater diameter than the depths of the grooves, so that they are under compression and distorted to a generally elliptical shape, as illustrated.

The arrangement for the lower tape 10 is the same, with O-ring 58 and 59 in the member 42 bearing against the undersurface of the tape 10, while additional O-rings 60 and 61 in the central member 41 seal the upper side of the lower tape.

Figure 2:
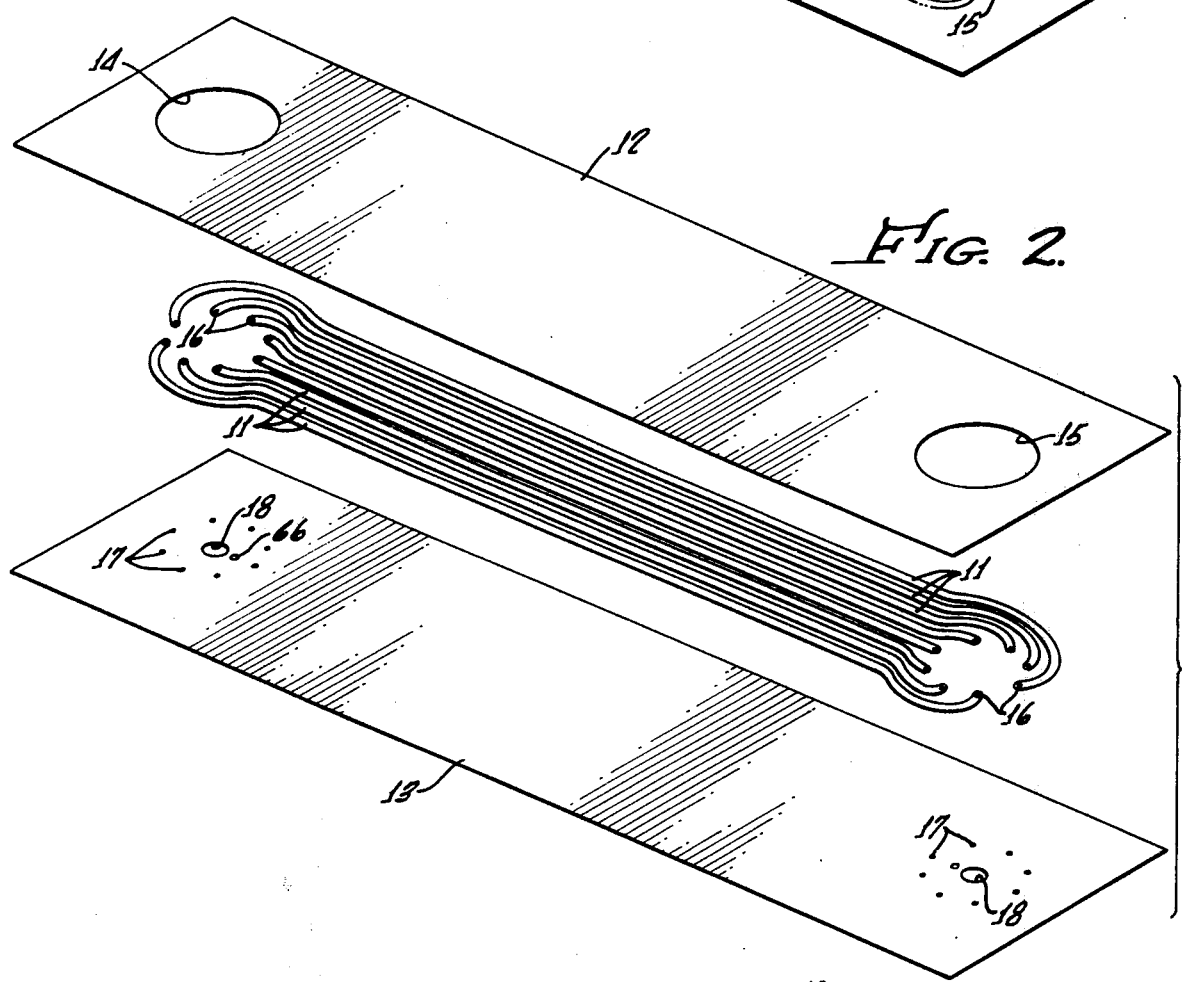
FIG. 2 is an exploded perspective view of the components of the tape of FIG. 1.
Figure 3:
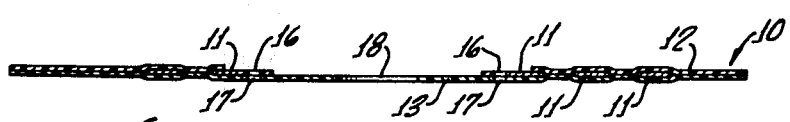
FIG. 3 is an enlarged transverse sectional view taken along line 3—3 of FIG. 1.

Another feature illustrated in FIG. 9 is a polarizing arrangement to assure proper relative rotational positioning of the parts of the assembled coupler. This, in turn, assures interconnection of the correctly matching conductors 11 of the tapes 10 as well as aligning the pins and openings for assembly. For the polarizing arrangement, the inner dielectric member 41 is provided with a cylindrical opening 63 extending through it parallel to the axis. The opening 63 receives a substantially complementary projection 64 that extends inwardly from the radial face 47 of the dielectric member 40. A similar projection 65 from the member 42 is received in the opposite end of the opening 63. The projections 64 and 65 also extend through complementary openings 66 formed in the sheets 13 of the tapes 10. (The openings 66 may be seen in FIGS. 1 and 2.) With this arrangement, it is impossible to complete the assembly without the tapes 10 assuming predetermined rotational positions relative to each other and to the pins 26. Therefore, the interconnections of the conductors 11 and the pins 26 are controlled. Of course, the locations of the openings 66 may be varied to change the rotational position at which a tape may be assembled into the coupler.

A variation in the seal for the contacts is shown in the embodiment of FIG. 10. Preformed seals are used in this design rather than O-rings, as in the previously described arrangement. The outer dielectric members 67 and 68 of the coupler of FIG. 10 are provided with peripheral annular flanges 69 and 70, respectively. Each of these is received in the annular recess 71 of a seal 72 of elastomeric material. The latter members present flat surfaces 73 adjacent the tapes 10 and circumscribe the pattern of contact pins 74. On the inside of the pattern of the contacts, the members 67 and 68 are provided with annular recesses 75 and 76, respectively, which receive annular sealing members 77. Annular ridges 78 and 79 in the members 67 and 68 are positioned between the seals 72 and 77.

On the opposite faces of the center dielectric member 80 are seals 81, which have outer recesses 82 to receive the peripheral flanges 83 and 84 of the member 80. The seals 81 also are recessed annularly to receive the annular ridges 85 and 86 found on the opposite radial surfaces of the central dielectric member 80. The thin portions of the seals 81 adjacent the ridges 85 and 86 are provided with circular openings 87, which receive the frustoconical portions 88 of the contacts 74.

In this embodiment, a different form of contact pin is shown. Instead of being machined parts, as in the previously described embodiment, the contacts 74, seen in detail in FIGS. 10 and 11, are rolled from sheet metal. This provides a price advantage in manufacture. The same results as those realized from the contacts 26 are accomplished by the contacts 74, as their tapered ends 88 distort the conductors 11 around their openings 16 so as to provide firm engagement over a substantial area.

Also, in the embodiment of FIG. 10, two opposed Belleville washers 90 are used beneath the head 91 of a special nut 92 that receives a bolt 93 in securing the elements of the coupler together. The bolt 93 has a flush head 94 received in a spot face on a large washer 95, the undersurface of which engages the end 96 of the nut 92. This limits the movement of the bolt 93 into the nut 92 so that the undersurface of the washer assumes a predetermined position and the nut will not collapse the Belleville washers 90.

The insulating members 67, 68 and 80 are indexed and prevented from relative rotation by means of a post 97 on the central portion of the member 68, which fits within complementary openings 98 and 99 in the members 67 and 80, respectively. The post 97 has a substantially square exterior, as seen in FIG. 13, which rotationally fixes the various parts when the coupler is assembled.

Figure 14:
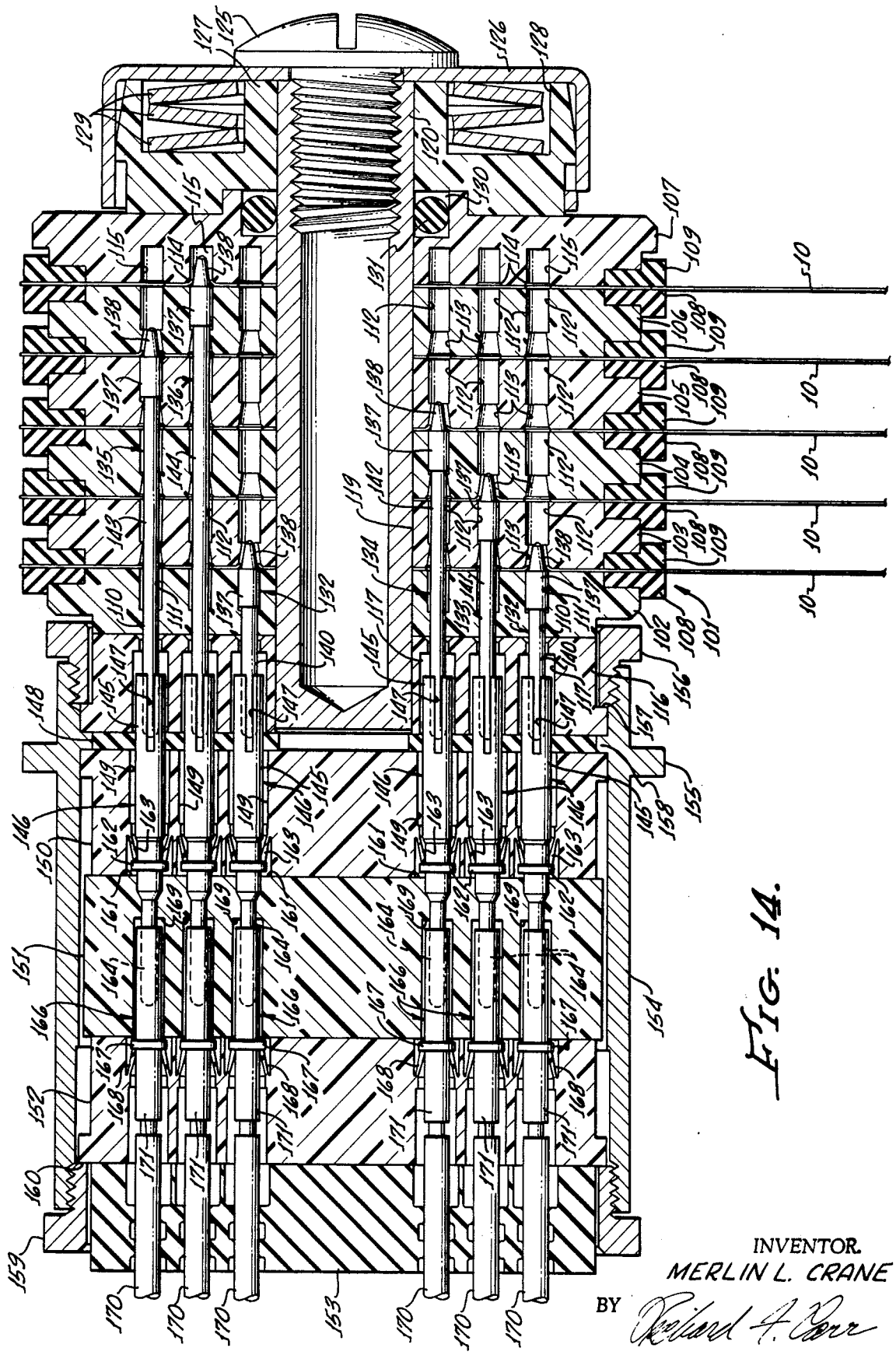
FIG. 14 is a longitudinal sectional view of a connector that will provide electrical circuits between an assembly of several tapes and a group of wires.

The arrangement shown in FIG. 14 provides a means for connecting the printed circuit tapes 10 to wires. In the embodiment shown, there is an assembly 101 which includes a stack of five tapes 10 having contact pins adapted for connection to the wires. The tapes 10 extend between the radial faces of adjacent plastic disks 102, 103, 104, 105, 106 and 107. The outer edges of these disks are recessed to receive seals 108 and 109, which are substantially L-shaped in cross section and bear against the opposite sides of the tapes 10.

Aligned openings extend through the disks to receive the contact pins. In the disk 102, this includes a plurality of cylindrical openings 110, at one end of each of which is a counterbore 111. The other disks, 103, 104, 105 and 106, have openings with ends 112 corresponding in length and diameter to the counterbores 111 in the disk 102. The openings in these disks have outwardly flared portions 113 that extend from the sections 112 of the openings to frustoconical entrance portions 114. The disk 107 has a frustoconical entrance portion 114, as for the other openings, connecting to an inner cylindrical portion 115 that is of the same diameter as the opening sections 111 and 112.

At the left-hand end of the disk 102, as the device is shown, is an additional plastic disk 116 in which are openings 117 that are aligned with the openings in the other plastic disks.

Figure 15:
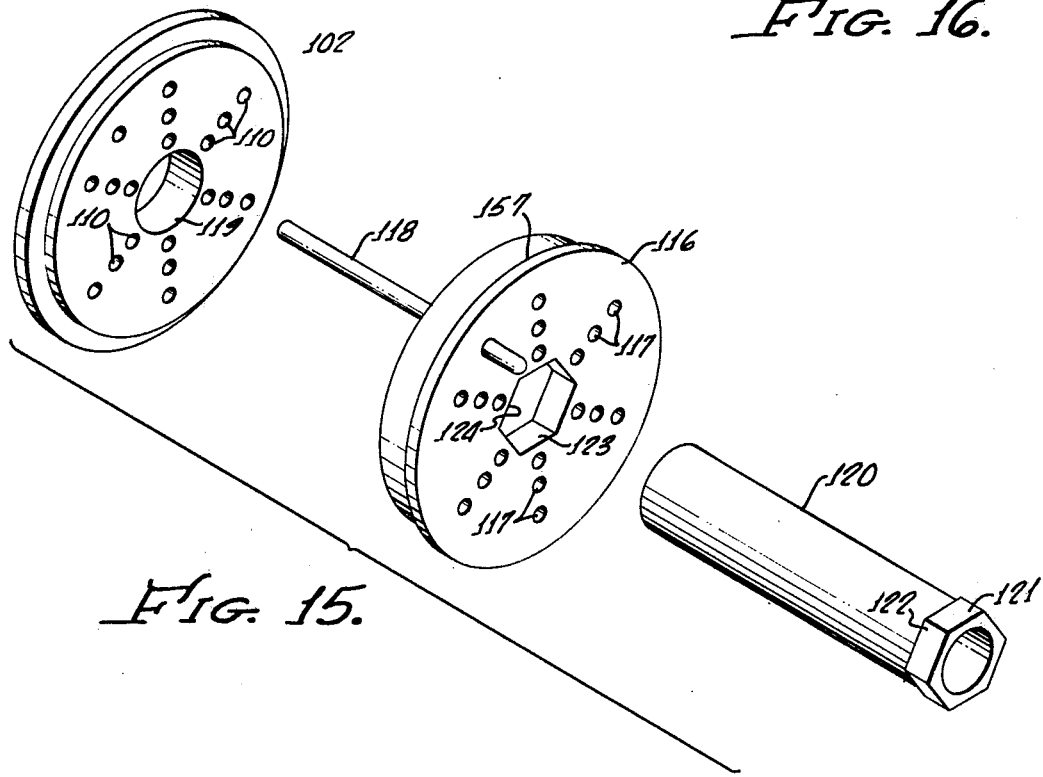
FIG. 15 is an exploded perspective view of certain components of the connector of FIG. 14.

The assembly of disks and tapes is indexed and polarized by a rod 118 (see FIG. 15) that passes through complementary openings in the disks and tapes, extending the length of the assembly.

A cylindrical opening 119 is provided in the disks 102, 103, 104, 105, 106, 107 and 116, through which extends a sleeve 120. The end 121 of the sleeve 120 has a hexagonal exterior defining a shoulder 122 between this end portion and the remainder of the length of the sleeve 120, which is of cylindrical configuration (see FIG. 15). The sleeve end 121 is received with a force fit within a complementary axial recess 123 in the disk 116, while the sleeve shoulder 122 is adjacent a shoulder 124 at the end of the hexagonal recess 123. The remainder of the axial opening in the disk 116, as well as the axial openings in the other plastic disks, is substantially complementary to the exterior of the sleeve 120.

The outer end of the sleeve 120 is internally threaded and receives the shank of a screw 125. The screw head overlaps the outer surface of a cup-shaped metal end cover 126 which receives a plastic end member 127. The latter element has an outwardly facing annular recess 128 which receives three Belleville washers 129. As a result of this construction, the sleeve 120 and screw 125 hold the assembly of plastic disks together, while the Belleville washers 129 apply a predetermined axial force on the assembled disks, as in the previously described embodiments.

The disk 107 is recessed at its inner corner to define an annular space 130 with the end member 127 and the sleeve 120 in which is an O-ring 131 that provides a moisture seal at the center of the unit.

Five different sizes of contact pins 132, 133, 134, 135 and 136 are received within the aligned openings in the assembled plastic disks 102–107. These pins are identical at one end, having cylindrical portions 137 from which project tapered outer parts 138, which are similar in configuration to the corresponding portions 25 and 27, respectively, of the contact pins 26. The cylindrical parts 137 of the pins fit within the portions 111 or 112 of the openings through the disks. The tapered portions 138 are forced into the openings 16 of the conductors 11 of the tapes 10, forming electrical connections as described above. The opposite ends 140, 141, 142, 143 and 144 of the pins are cylindrical and of different lengths. This permits the tapered ends 138 of the contact pins to extend to different tapes 10, while the tips of their opposite ends all substantially fall in the same plane. For example, the shorter pin 132 engages the tape 10 between the disks 102 and 103, while the pin 135 extends well beyond this point to the tape 10 between the disks 105 and 106. The ends 140 and 143 of these two pins, however, terminate at the same general location.

The longer contact pins necessarily pass through openings in the tapes 10 other than the one with which they are to make electrical contact. Thus the pin ends 141, 142, 143 and 144 must pass through openings in various tapes 10. However, no electrical engagement is made by these pin ends because the intermediate tapes are not provided with conductors 11 at the locations where the pin ends are present. Only the tapered pin ends 138 engage conductors 11 of the tapes 10 to form an electrical connection.

The ends 140-144 of the pins 132-136 are received in socket ends 145 of additional contacts 146. The socket ends 145 have longitudinal slots 147 enabling the contacts 146 to bear resiliently against the pin ends 140-144, thereby providing electrical connections. The contacts 146 extend through a gasket 148 and into openings 149 in inserts 150 and 151 of a rigid dielectric material, such as plastic. The gasket 148 is positioned between the end face of the disk 166 and of the insert 150. The inserts 150 and 151 are bonded together at their mating faces, while an additional insert 152 is bonded to the end of the insert 151. The openings continue into the insert. At the end of the insert assembly is a sealing grommet 153 of resilient elastomeric material. A metal shell 154 extends around the assembly of the inserts 150, 151 and 152, the shell having an outer flange 155 to permit its connection to a bulkhead or other structure. A nut 156 is received in one end of the shell 154, engaging an annular shoulder 157 on the plastic disk 116. This holds the assembly 101 to the shell 154, with the end of the disk 116 engaging an annular ridge 158 on the inner surface of the shell.

A nut 159 at the opposite end of the shell 154 engages a shoulder 160 on the insert 152. This retains the inserts 150, 151 and 152 within the shell 154.

The openings 149 are reduced in diameter at the transition between the inserts 150 and 151, providing annular shoulders 161 in the openings. The contacts 146 include annular enlargements 162 which provide forwardly facing shoulder adjacent the shoulders 161 of the openings. This prevents forward movement (to the left as shown) of the contacts 146. Rearward movement of the contacts 146 is prevented by a plurality of spring fingers 163 which project inwardly and forwardly from the periphery of the opening 149 in the insert disk 150. The ends of the fingers 163 are adjacent the rearward shoulder defined by the annular enlargements 162, so that the contacts 146 are prevented from movement in the rearward direction.

Beyond the annular enlargements 162, the contacts 146 include pin portions 164, which extend into enlarged portions of the openings 149 in the insert 151. There, the pin portions 164 are received within the openings of socket contacts 166, which are of conventional construction. The socket contacts 166 include annular enlargements 167, which define shoulders by which these contacts are retained against axial movement. Spring fingers 168 on the insert 152 are positioned behind the enlargements 167 to prevent rearward movement (leftward as shown) of the contacts 166. The openings 149 are reduced in diameter adjacent the forward ends of the contacts 166, providing shoulders 169 engageable by the contact ends to preclude forward movement. Wires 170 extend through the grommet 153 and are received in barrel ends 171 of the contacts 166. The barrel ends of the contacts 166 are crimped to the wires to form both the mechanical and electrical connections.

By this arrangement, therefore, the tapes 10 with their varying circuitry are connected through pins 132-136 and contacts 146 to the conventional socket contacts 166 and the wires 170. The contacts 166 may be removed if desired by the use of a conventional removal tool which will pry the fingers 168 outwardly to clear the annular enlargement 167 to free the contact 166 so that it can be pulled outwardly by the wire 170.

It is possible to construct the terminal junction device such that the ends 140-144 of the contact pins 132-136 directly engage socket contacts 166. However, tolerance buildups are such in the tape assembly that there can be a substantial variation in the locations of the pin ends. Conventional socket contacts, on the other hand, normally have only a narrow range within which a pin can be positioned relative to it while assuring electrical contact. In other words, the relative axial positions of the pin and socket must be closely controlled or a circuit may not be completed between them. Because the tolerance buildup in the tape assembly may result in variations in the positions of the tips of the pin ends 140-144, it is possible that some would not mate properly with their corresponding socket contacts. Consequently, the arrangement of FIG. 14 may be preferred, affording the advantage of conventional removable contacts, while the intermediate contacts facilitate the connection between the tapes and the wires.

Figure 16:
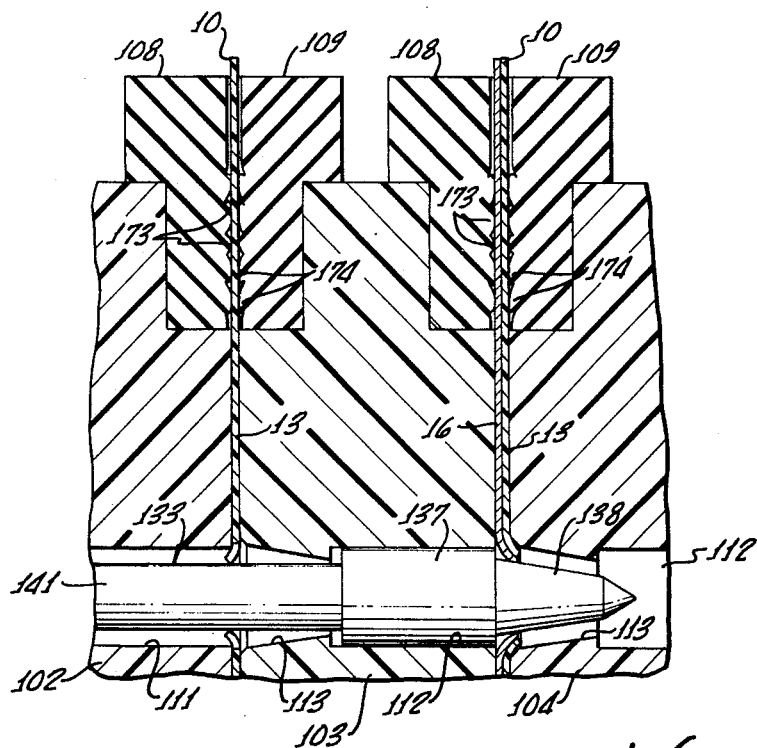
FIG. 16 is an enlarged fragmentary view showing the relationship of the pins and the tapes, as well as a modified form of seal.

The seals 108 and 109 may include ridges or teeth 173 and 174 on the surfaces that engage the tapes 10 (see FIG. 16). This enhances the sealing effect, while permitting the seals to bear against the tapes only relatively lightly. This, in turn, assures that the seals will not impose significant axial forces on the assembled disks of the tape connection unit and will not interfere with the compression force provided by the Belleville washers 129.

Figure 17:
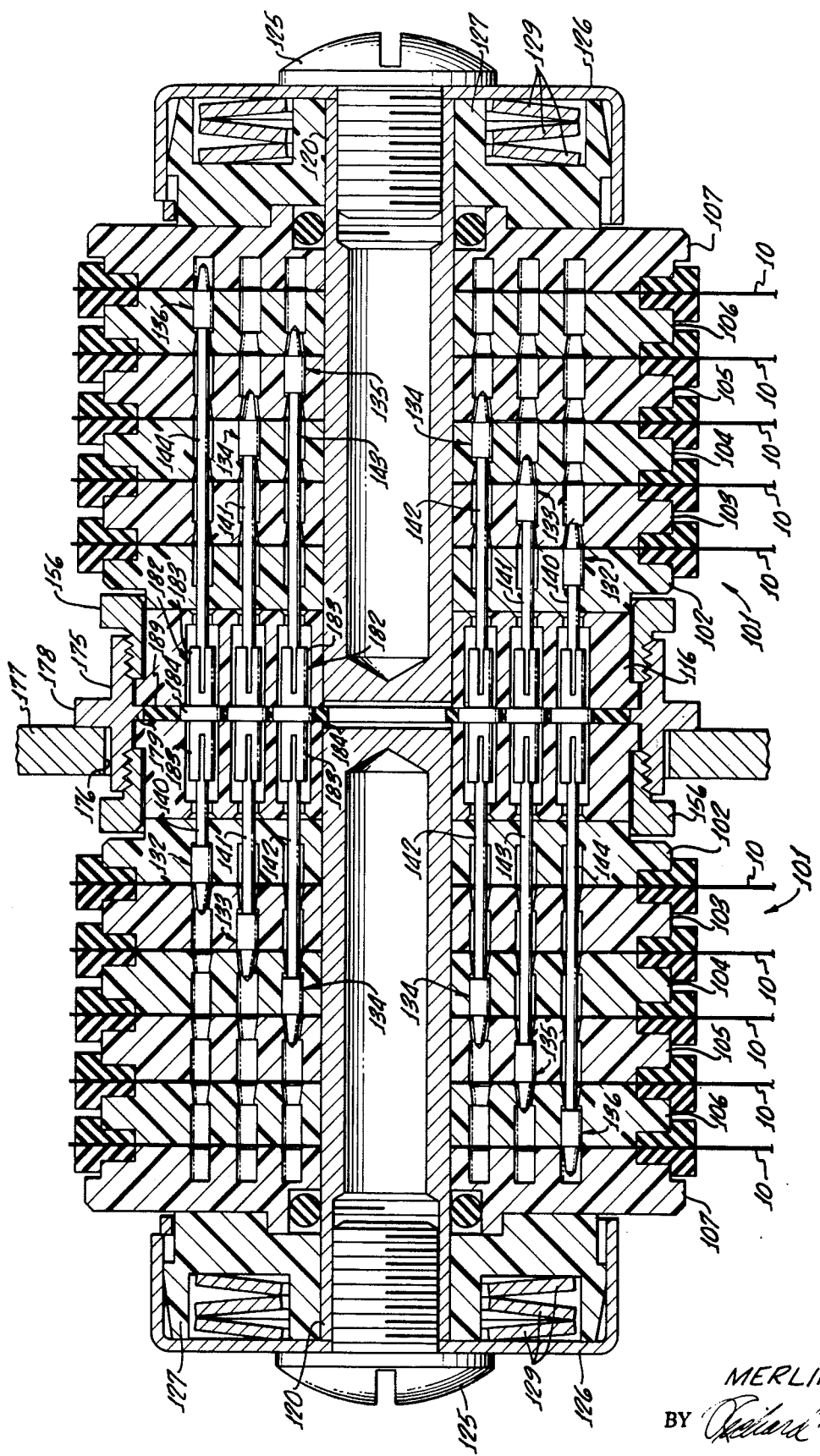
FIG. 17 is a longitudinal sectional view of a connector for interconnecting a plurality of tapes on one side of a bulkhead to a second group of tapes on the opposite side of the bulkhead.

The tape assembly 101 of FIG. 14 may be used in providing a tape-to-tape connection through a bulkhead, as shown in FIG. 17. Here, there are two of the tape units 101, each of which has a series of tapes 10 connecting to its pins 132-136. The two units 101, through nuts 156, connect to a short tubular member 175, engaging threads on its interior surface at its opposite ends. One end portion of the member 175 fits through an opening 176 in a bulkhead 177, while a flange 178 on the member 175 provides a means for attachment to the bulkhead.

On the interior of the member 175 at its midpoint is a short annular flange 179, inwardly of which is a gasket 180.

Within the openings of the adjacent plastic disk 116 are contacts 182. Each contact includes a split tubular portion 183 at either end, these portions extending into the two tape assemblies 101. The contact portions 183 receive and bear against the ends 140-144 of the contact pins 132-136. Thus, the split ends 183 of the contacts 182 generally resemble the split ends 145 of the contacts 146 of the embodiment of FIG. 14. Intermediate the end portions 183 are annular enlargements 184 which provide oppositely facing radial shoulders that are engaged by the adjacent end surfaces of the plastic disk members 116. This positions the contacts 182 against axial movement. In this embodiment of the invention, either of the tape assemblies 101 may be removed from the central tubular member 175 independently of the other.

Figure 18:
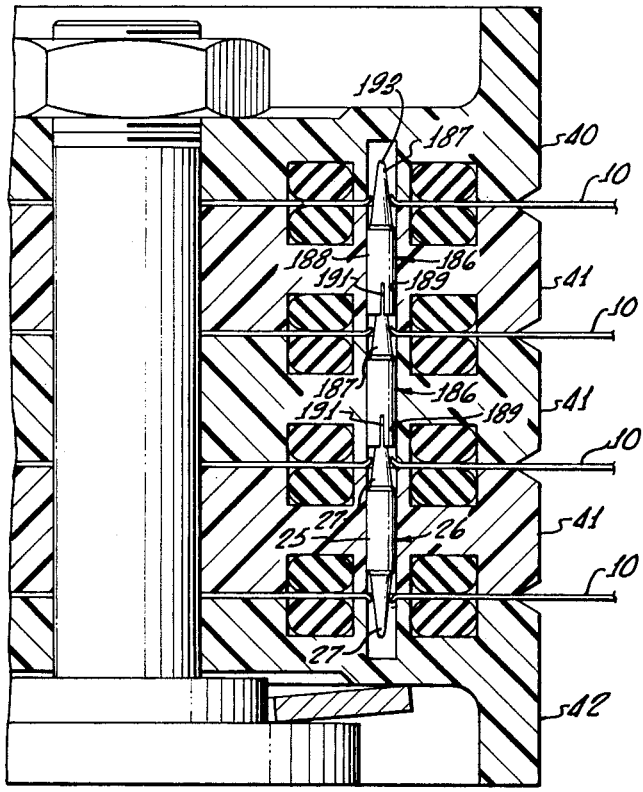
FIG. 18 is a fragmentary longitudinal view of a connector in which adapters are provided for the pins to permit a single pin assembly to engage the conductors of several tapes.

In some instances, connections are needed between adjacent tapes in an assembly of more than two tapes in a coupler unit. This may be accomplished by the arrangement of FIG. 18, where the basic construction of the coupler resembles that of FIG. 9. However, there are three of the central disks 41 in the embodiment of FIG. 18 intermediate the end disks 40 and 42. This unit can accommodate four tapes 10. The lower two tapes 10 in the design, as illustrated, are interconnected by a pin 26 in the conventional manner. In order to make a connection as well to the upper two tapes 10, adapters 186 are provided. Each adapter 186 includes a tapered end portion 187, which has the same contour as the tapered end 27 of the pin 26. There is also a central cylindrical portion 188 which is adapted to fit within the openings in the disks 41 with a press fit to position the adapters within the disks. At their opposite ends 189, the adapters 186 include axial cylindrical openings 190 and longitudinal slots 191. Outwardly flaring frustoconical entrance portions 192 are provided for the openings 190.

Figure 19:
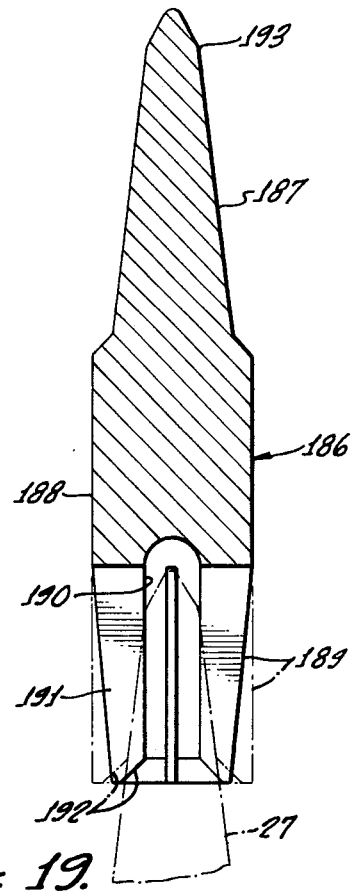
FIG. 19 is a longitudinal sectional view of one of the adapters of the connector of FIG. 18.

The openings 190 are adapted to receive an end portion 27 of a pin 26 or an end portion 187 of an adapter 186. The diameter of the opening 190 corresponds to that of the tip end 38 of the pin 26 and the tip end 193 of the adapter 186. Consequently, the end 27 or 187 can enter the opening 190 and, as it moves into the opening, its tapered wall expands the end portion 189 of the adapter outwardly. This is indicated in phantom in FIG. 19. As a result, the adapter bears tightly against the pin end it receives, and an electrical connection is made.

Figure 20:
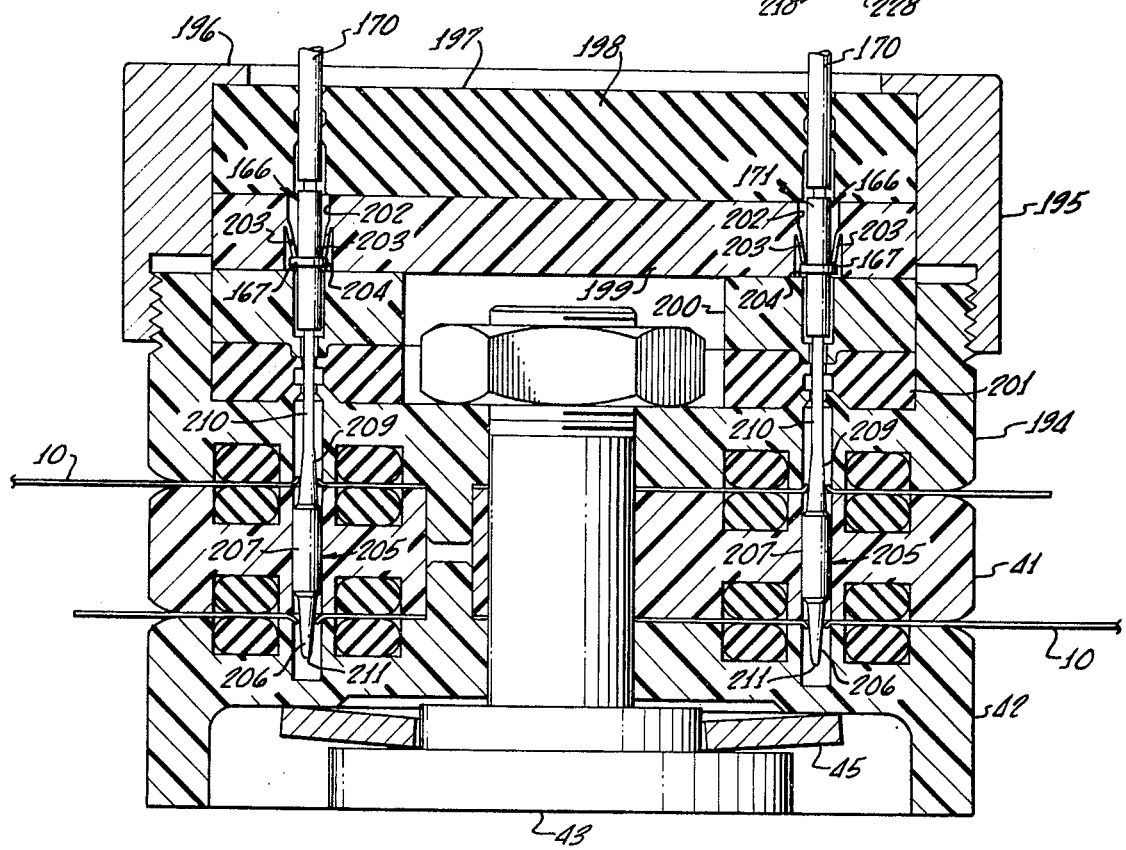
FIG. 20 is a longitudinal sectional view of a connector in which the pins are adapted to engage two tapes and have extensions for mating with conventional socket contacts.

The arrangement of FIG. 20 provides a means for connecting an assembly of two tapes to a standard socket contact. The main components of the tape assembly portion of the unit of FIG. 9 are the same as those in FIG. 20. Thus, a bolt 43 holds the assembly together, loaded by a Belleville washer 45 that bears against the end of a plastic disk 42. A disk 41 is at the center of the unit, but at the opposite end the disk 40 is replaced by a disk 194, which is externally threaded. The member 194 is engaged by a nut 195, which has a rearward flange 196 bearing against the outer surface 197 of a resilient grommet 198. Inwardly of the grommet 198 are rigid plastic inserts 199 and 200, beyond which is an elastomeric gasket 201. Openings 202 extend through the members 198, 199, 200 and 201, receiving standard socket contacts 166, which are crimped to wires 170. Integral spring fingers 203 project inwardly from the wall of the opening 202 within the plastic insert 199, bearing against the rearward shoulder defined by the annular enlargement 167 of a contact 166, thereby holding the contact against rearward movement. The opening 202 is of reduced diameter through the insert 200 so that a shoulder 204 is provided adjacent the forward edge of the enlargement 167 of the contact 166 to prevent forward movement of the contact.

Within the plastic disk 41 is a pin 205, which has an end 206 that is identical to the ends 27 of the pins 26. The intermediate portion 207 of the pin 205 is likewise similar to the intermediate part 25 of the pin 26, being embedded in the opening in the disk 41. The opposite end of the pin 205 is elongated. It includes a first portion 209, which is frustoconical and tapered in the same manner as the end 206. This narrows down to an elongated cylindrical portion 210 which is the same diameter as the tip 211 of the end 206. The end portion 210 of the pin 205 extends through the gasket 201 and into the socket contact 166. In this manner, a connection can be made between both of the tapes 10, which are engaged by the pin 205, and the wire 170 that connects to the contact 166.

Figure 21:
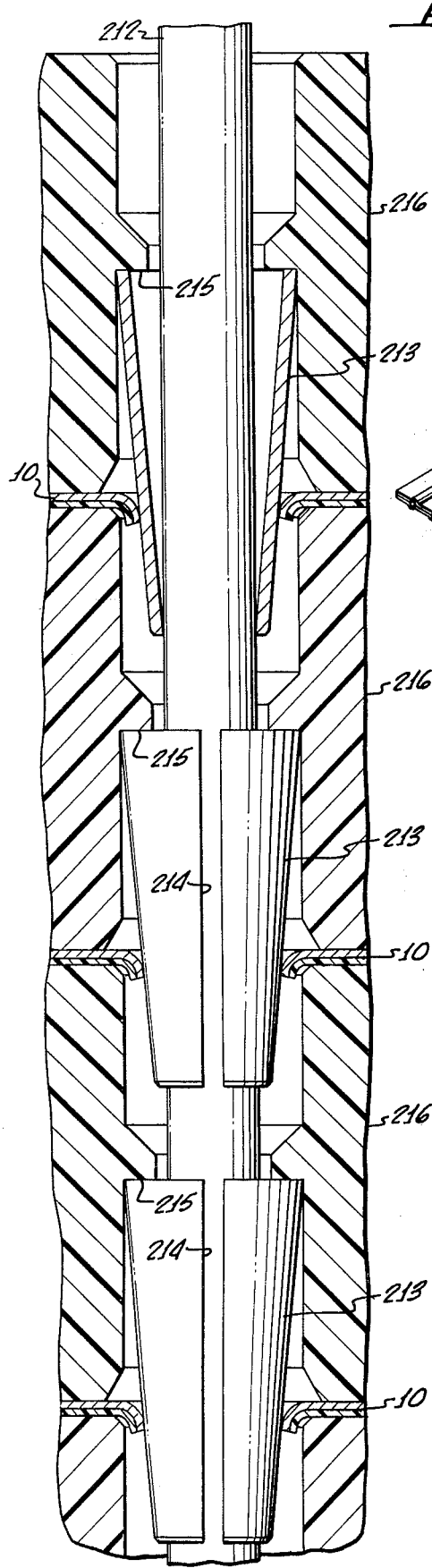
FIG. 21 is an enlarged fragmentary view of a connector arrangement utilizing cylindrical pins on which are positioned tapered sleeves for engagement with the tapes.

A simplified form of pin for use with the tapes 10 is shown in FIG. 21. In this arrangement, the pin 212 is of constant cylindrical diameter. Received on the pin 212 at the locations where connections are to be made to the tape 10 are frustoconical sheet metal sleeves 213. These may be made from flat sheets rolled to the configuration shown, providing, therefore, a slot 214 extending the length of the sleeve 213. The sleeve 213 is made to a dimension slightly less than that of the pin 212 at its narrow end so that it produces a compressive force on the pin 212 to make an electrical connection therewith. The tape 10 fits over the frustoconical sleeve 213 when the coupler is assembled. Internal shoulders 215 in the plastic disks 216 of the coupler anchor the sleeves 213 against movement when the tapes are forced onto them.

As the tape 10 is deflected by the tapering wall of the sleeve 213, it exerts a compressive force on the sleeve. This produces a good electrical connection between the conductor 11 and the sleeve 213, just as it did with the solid pins previously described. Furthermore, the compression on the sleeve 213 increases the inwardly directed force the sleeve exerts against the pin 212. Therefore, this improves the electrical connection between the sleeve 213 and the pin 212.

Figure 22:
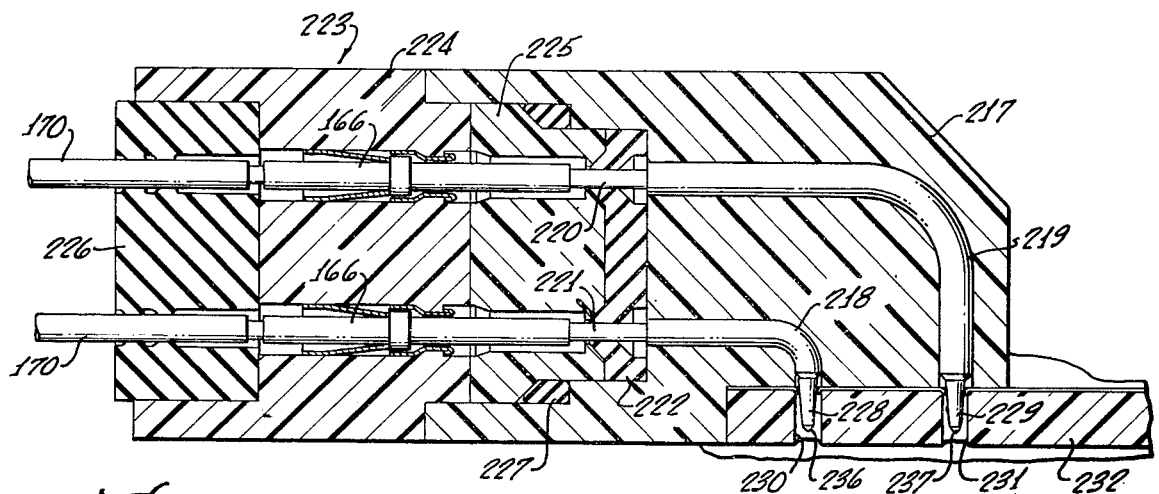
FIG. 22 is a longitudinal sectional view of a connector which connects to the conductors on a printed circuit board without the use of solder.
Figure 23:
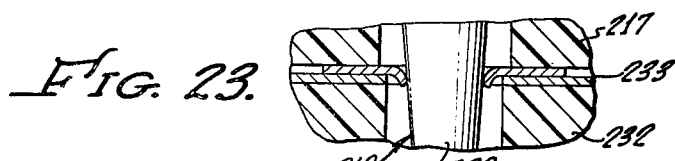
FIG. 23 is an enlarged fragmentary view showing the connecting arrangement for one of the pins of the connector of FIG. 22.

The principle of deflecting a conductive member by a tapered pin to complete an electrical circuit can be used in making connections other than by means of printed circuit tape. In the embodiment of FIG. 22, connections are made to a printed circuit board without soldering. In this construction, there is a body of plastic 217 which contains curved pins 218 and 219. The pins 218 and 219 have end portions 220 and 221 of reduced diameter, which project outwardly through a resilient rubber gasket 222 to enter standard socket contacts 166 carried by a plug 223. The latter member includes rigid plastic members 224 and 225 and a resilient rubber grommet 226 through which the wires 170 extend. An O-ring 227 forms a moisture seal at the connection between the plug 223 and the plastic body 217.

The curved pins 218 and 219 also include frustoconical end portions 228 and 229 of identical tapered configuration, resembling the tapered ends 27 of the pins 26. The pin ends 228 and 229 extend into openings 230 and 231 in a printed circuit board 232. The latter member has conductors 233 and 234 on the surface of the board adjacent the plastic body 217. The cylindrical openings 230 and 231 extend through both the board and the conductors 233 and 234. Between the conductors 233 and 234 and the adjacent face of the plastic body 217 are washers 235 of electrically conductive material. The latter members are provided with openings that are of the same diameter as the tips 236 and 237 of the pin ends 228 and 229. Consequently, when the pin ends 228 and 229 enter the openings 230 and 231, they deflect the washers 235 in a manner similar to that of the deflection of the conductors 11 of the tapes 10. This forms an electrical connection between the pin ends 228 and 229 and the washers 235. Also, the washers 235 are wedged into the openings 230 and 231 in the conductors 233 and 234, respectively, forming electrical connections at those locations. Therefore, there is electrical continuity between the pins 218 and 219 and the conductors 233 and 234 of the printed circuit board. This electrical connection is made without the use of solder and, therefore, is much more readily effected than conventional connections to printed circuit boards. The washers 235 may be carried by plastic tape similar to the sheet 13 for ease in positioning them at the openings in the printed circuit board.

Figure 24:
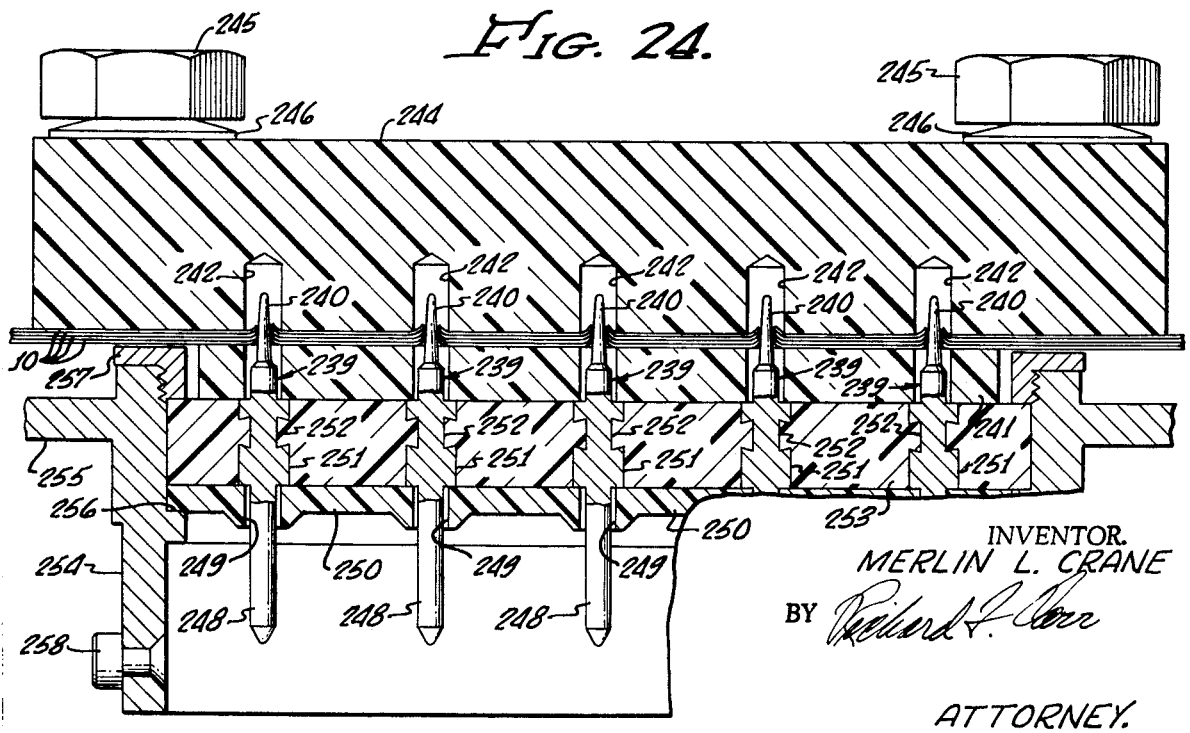
FIG. 24 is a longitudinal sectional view of a connector in which a plurality of tapes is received on the tapered portion of each pin.

A connection to a plurality of superimposed tapes 10 is made by a single pin in the embodiment of FIG. 24. Here, there are pins 239 having tapered ends 240 projecting outwardly from a body 241 of dielectric material. The ends 240 of the pins 239 extend into openings 242 in a cover member 244. The latter element is held on by screws 245 beneath the heads of which are Belleville washers 246. Between the adjacent surfaces of the members 241 and 244 are four tapes 10 in the embodiment illustrated. Each of these tapes fits over the tapered end 240 of one of the pins 239. This deflects the material of the tape outwardly at each of the openings through it, so that connections are made by all of the tapes to the pins 239. This permits multiple connections to be made in a small-sized unit of simple construction. However, there is not as much deflection of the tapes positioned toward the outer ends of the pins 239 as there is at the inner tapes. Consequently, the electrical connection for the tapes becomes progressively less secure toward the outer ends of the pins. Thus, the unit of FIG. 24 cannot withstand the severe service conditions which are possible with various other described embodiments.

In the embodiment of FIG. 24, the pins 239 serve also as the contact pins for what is the equivalent of the receptacle of a conventional electrical connector. Consequently, these pins have opposite ends 248 which extend through openings 249 in an insert 250 and project outwardly beyond its forward face. The central portions 251 of the pins 239 are of larger diameter, but with intermediate annular grooves 252. The intermediate portions 251 are molded into an insert 253 of rigid dielectric material, with the grooves 252 enabling the pins 239 to be securely locked in the insert. The body 241 acts as an additional insert, and the adjacent faces of the inserts 241, 250 and 253 are bonded together.

Surrounding the inserts 241, 250 and 253 is a receptacle shell 254 having an exterior mounting flange 255. The inserts are held in the shell by an annular shoulder 256 at the forward end and a nut 257 at the rearward edge of the insert 253. A bayonet pin 258 at the forward end of the shell 254 provides a means for coupling to the shell of a standard connector plug. The plug will carry conventional socket contacts for engagement with the ends 248 of the pins 239. The ends 248 may be made as socket contacts if it is desired that the pins be located in the plug portion of the connector.

The provision of a connector receptacle in conjunction with an attachment to one or more tapes is not limited to the device of FIG. 24, but may be applied to other versions of the invention as well. For example, in the design of FIG. 14, the ends 164 of the pins 146 may serve as receptacle pin contacts, projecting from the forward face of a suitable insert. The shell 154 then will be replaced with an appropriate receptacle shell similarly threaded onto the member 156.

Figure 25:
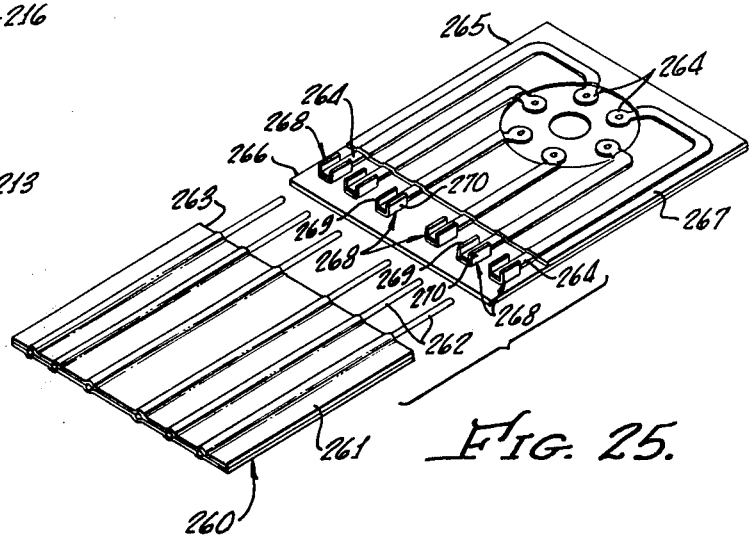
FIG. 25 is an exploded perspective view illustrating an arrangement for connecting from a printed circuit tape to an assembly of parallel wires.
Figure 26:
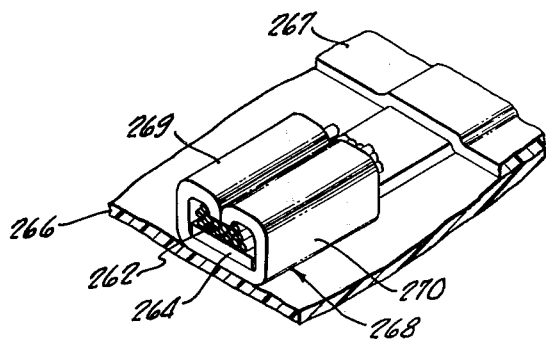
FIG. 26 is a fragmentary perspective view showing the connection between one of the conductors of the printed circuit tape and the wire assembly.

At the present time, it is not practical to manufacture printed circuit tape, such as the printed circuit tape 10, in lengths exceeding 6 feet. Requirements may exist, however, to interconnect printed circuit tapes that are at widely spaced locations. This may be accomplished by adapting the printed circuit tape to connect to a run of multiple-conductor cable or stranded wire, as well as to one of the coupling devices of this invention. This arrangement is illustrated in FIGS. 25 and 26. The wire assembly 260 is made up of a laminated flat strip of insulation 261 within which are parallel conductors 262, which may be flat cable or stranded wire as shown.

The wire assembly 260, only an end fragment of which is illustrated, may be made much longer than a printed circuit tape. The ends of the wires 262 project outwardly beyond the end edge 263 of the insulation 261. The conductors 264 of the printed circuit tape 265 are adapted to connect to the exposed ends of the wires 262. In order to make this possible, the plastic sheet 266 of the tape extends outwardly at one end beyond the other sheet 267. The conductors 264 also extend past the edge of the sheet 267, so that there is a short length of each conductor exposed along the upper surface of the sheet 266. At their opposite ends, the conductors 264 are arranged in a circular pattern, and exposed by a circular cutout in the sheet 267, permitting the conductors to be connected to the pins of a coupling device, as described above.

Also carried by the insulating sheet 266 at the exposed ends of the conductors 264 are U-shaped clips 268. There is one clip 268 for each exposed end of a conductor 264, with the central portions of the clips 268 positioned between the conductors and the sheet 266. The exposed conductor ends and the clips 268 are in a parallel relationship, spaced apart distances corresponding to the spacing of the wires 262 of the unit 260.

In connecting the wires 262 to the conductors 264, the ends of the wires 262 are superimposed on the conductors 264 within the clips 268. Then, the side portions 269 and 270 of the clips 268 are crimped inwardly to be compressed against the wires 262 and force the wires tightly against the surfaces of the conductors 264 (see FIG. 26). This completes electrical circuits between the conductors 264 and the wires 262, also mechanically attaching these elements together. This simple procedure permits the use of the printed circuit tapes where very long runs are necessary. Ordinarily, the zone of the connection between the wires 262 and the conductors 264 will be potted after the crimping of the clips 268 to provide insulation at that location.

The foregoing detailed description is to be clearly understood as given by way of illustration and example only, the spirit and scope of this invention being limited solely by the appended claims.

I claim:

1. In combination with a printed circuit tape, said tape including flexible sheet means of dielectric material, and a plurality of relatively thin flat spaced electrical conductors secured to and carried by said sheet means, said conductors having openings therethrough, said openings being arranged in a circular pattern, a device for forming an electrical connection with said tape comprising a first element of substantially rigid dielectric material, a second element of substantially rigid dielectric material, a plurality of spaced pins of electrically conductive material carried by said second element, said pins having tapered portions projecting outwardly from a surface of said second element, said pins being arranged in a circular pattern concentric with said pattern of said openings, said tapered portions being received in said openings in said conductors and deflecting said conductors outwardly along the surfaces of said tapered portions for forming electrical connections therewith, said first element having apertures receiving said tapered portions of said pins and said deflected portions of said conductors, means for rotationally indexing said tape relative to said pins, and means relatively urging said first element against said surface of said second element for gripping said conductors between said surface of said second element and the peripheries of said apertures in said first element, said peripheries of said apertures in said first element closely circumscribing said tapered portions for providing only limited portions of said conductors for deflection by said tapered portions.

2. A device as recited in claim 1 in which said means for rotationally indexing said tape relative to said pins includes a projecting member on one of said elements, said tape having an opening receiving said projecting member.

3. In combination with a printed circuit tape, said tape including flexible sheet means of dielectric material, and a plurality of relatively thin flat spaced electrical conductors secured to and carried by said sheet means, said conductors having openings therethrough, a device for forming an electrical connection with said tape comprising a first element of substantially rigid dielectric material, a second element of substantially rigid dielectric material, a plurality of spaced pins of electrically conductive material carried by said second element, said pins having tapered portions projecting outwardly from a surface of said second element, each of said pins including
  an elongated cylindrical rod,
  and a longitudinally split sheet metal sleeve circumscribing said rod,
  said sleeve having a relatively narrow end and a relatively wide end, whereby said sleeve defines said tapered portion, said sleeve resiliently gripping said rod at said relatively narrow end of said sleeve, said tapered portions being received in said openings in said conductors and deflecting said conductors outwardly along the surfaces of said tapered portions for forming electrical connections therewith, said first element having apertures receiving said tapered portions of said pins and said deflected portions of said conductors, and means relatively urging said first element against said surface of said second element for gripping said conductors between said surface of said second element and the peripheries of said apertures in said first element, said peripheries of said apertures in said first element closely circumscribing said tapered portions for providing only limited portions of said conductors for deflection by said tapered portions.

4. An electrical connector device comprising at least two printed circuit tapes, each of said tapes including flexible sheet means of dielectric material, and a plurality of spaced thin conductors carried by said sheet means, each of said conductors having an opening therethrough, said sheet means having an opening therethrough in registry with each of said openings in said conductors, a plurality of pins of electrically conductive material, each of said pins having a tapered portion, said tapered portions having relatively wide portions and relatively narrow portions spaced therefrom, said tapered portions of a first group of said pins being received in said openings in said conductors and said sheet means of a first one of said tapes with said conductors of said first tape positioned adjacent and relatively wide portions of said tapered portions and said sheet means of said first tape positioned adjacent said relatively narrow portions of said tapered portions of said pins of said first group, said tapered portions of said second group of said pins being received in said openings in said conductors and said sheet means of a second one of said tapes with said conductors of said second tape positioned adjacent said relatively wide portions of said tapered portions and said sheet means of said second tape positioned adjacent said relatively narrow portions of said tapered portions of said pins of said second group, means engaging said tapes on opposite sides thereof in spaced adjacency with said openings in said conductors for providing relatively narrow annular parts of said conductors unsupported around said openings therethrough, said relatively narrow annular parts of said conductors being deflected outwardly by said tapered portions toward said relatively narrow portions of said pins, said openings in said conductors being enlarged by said tapered portions for exerting an inward compressive force on said tapered portions, said pins having ends opposite said tapered portions thereof extending away from said tapes and terminating in substantially the same plane, a plurality of first electrical contacts, said first electrical contacts having socket ends receiving said opposite ends of said pins, said first electrical contacts having pin ends, a plurality of second electrical contacts, said second electrical contacts having socket ends receiving said pin ends of said first electrical contacts, said second electrical contacts having barrel ends, wires received in said barrel ends of said second electrical contacts, whereby circuits are completed from said tapes to said wires, and dielectric means carrying said first and said second electrical contacts.

5. A device as recited in claim 4 in which said socket ends of said first electrical contacts are longitudinally split tubular elements resiliently gripping said opposite ends of said pins.

6. An electrical connector device comprising
a printed circuit tape,
  said tape including flexible sheet means of dielectric material, and a plurality of spaced thin conductors carried by said sheet means,
  each of said conductors having an opening therethrough,
  said sheet means having an opening therethrough in registry with each of said openings in said conductors, a plurality of pins of electrically conductive material,
each of said pins having a tapered portion, said tapered portions having relatively wide portions and relatively narrow portions spaced therefrom,
said tapered portions being received in said openings in said conductors and said sheet means with said conductors positioned adjacent said relatively wide portions of said tapered portions and said sheet means positioned adjacent said relatively narrow portions of said tapered portions,
an additional one of said tapes, adapters extending from at least some of said pins to said additional tape,
each of said adapters including a split socket end receiving and resiliently bearing against the outer end of said tapered portion of said pin from which it extends,
said adapters having tapered opposite ends received in said opening of said additional tape in the manner said tapered portion of said pin is received in said opening of said first-mentioned tape,
and means engaging said tapes on opposite sides thereof in spaced adjacency with said openings in said conductors for providing relatively narrow annular parts of said conductors unsupported around said openings therethrough,
said relatively narrow annular parts of said conductors being deflected outwardly by said tapered portions thereof,
said openings in said conductors being enlarged by said tapered portions for exerting an inward compressive force on said tapered portions.

7. A device for making an electrical connection comprising
a first member of electrically conductive material,
said first member being relatively thin and deflectable and having an opening therethrough, said first member having a continuous wall around said opening,
a second member of electrically conductive material, said second member having a tapered portion received in said opening in said first member,
said tapered portion having a first part of relatively narrow lateral dimension at one location and a second part of relatively wide lateral dimension spaced therefrom,
said wall of said first member around said opening being deflected toward said first part of said tapered portion, so that said wall of said first member is in hoop tension and exerts a compressive force on said tapered portion and engages the same with area contact,
and sealing means around said tapered portion of said second member and said deflected portion of said first member for preventing access of moisture thereto.

8. A device for making an electrical connection comprising
a first member of electrically conductive material, said first member being relatively thin and deflectable and having an opening therethrough, said first member having a continuous wall around said opening,
a second member of electrically conductive material, said second member having a tapered portion received in said opening in said first member,
said tapered portion having a first part of relatively narrow lateral dimension at one location and a second part of relatively wide lateral dimension spaced therefrom,
said wall of said first member around said opening being deflected toward said first part of said tapered portion, so that said wall of said first member is in hoop tension and exerts a compressive force on said tapered portion and engages the same with area contact,
said second member at the end thereof opposite from said tapered portion including an elongated projecting portion,
a first electrical contact,
said first electrical contact having a socket portion receiving said elongated projecting portion of said second member and forming an electrical connection therewith,
said first electrical contact having a projecting pin portion,
a body of dielectric material receiving said first contact, means for holding said first contact in substantially a fixed position in said body of dielectric material, a second contact in said body of dielectric material, means holding said second contact in substantially a fixed position in said body of dielectric material,
said second contact having a socket end receiving said pin portion of said first contact and forming an electrical connection therewith,
and a wire engaging the opposite end of said second contact and forming an electrical connection with said second contact.

9. An electrical connector device comprising
a printed circuit tape,
said tape including flexible sheet means of dielectric material, and a plurality of spaced thin conductors carried by said sheet means,
each of said conductors having an opening therethrough and a continuous wall around said opening,
said sheet means having an opening therethrough in registry with each of said openings in said conductors,
a plurality of pins of electrically conductive material,
each of said pins having a tapered portion,
said tapered portions having relatively wide portions and relatively narrow portions spaced therefrom,
said tapered portions being received in said openings in said conductors and said sheet means with said conductors positioned adjacent said relatively wide portions of said tapered portions and said sheet means positioned adjacent said relatively narrow portions of said tapered portions,
means engaging said tape on opposite sides thereof in spaced adjacency with said openings in said conductors for providing relatively narrow annular parts of said continuous walls of said conductors unsupported around said openings therethrough,
said relatively narrow annular parts of said continuous walls of said conductors being deflected outwardly by said tapered portions toward said relatively narrow portions thereof,
said openings in said continuous walls of said conductors being enlarged by said tapered portions so that said continuous walls are in hoop tension for exerting an inward compressive force on said tapered portions, and at least one more of said tapes, said tapered portions of some of said pins being so received in said openings in said conductors of one of said tapes, said tapered portions of others of said pins being so received in said openings in said conductors of the other of said tapes, said pins having ends opposite said tapered portions thereof extending away from said tapes and terminating in substantially the same plane for engagement with another electrically conductive element.

10. A device as recited in claim 9 including in addition electrical contact means engaging said opposite ends of said pins and forming electrical circuits therewith.

11. A device as recited in claim 10 including in addition wires engaged by said electrical contact means, whereby circuits are completed from said tapes to said wires.

12. A printed circuit tape adapted for connection to a plurality of elongated electrically conductive members comprising a duality of sheets of flexible dielectric material, a plurality of spaced conductors intermediate said sheets, said conductors and one edge portion of one of said sheets extending outwardly beyond the adjacent edge of the other of said sheets, whereby said conductors are exposed on said edge portion of said one sheet, a clip for each of said conductors, said clips being carried by said edge portion of said one sheet and extending around said conductors for receiving additional elongated electrically conductive members, said clips being deflectable to grip such additional electrically conductive members and to hold the same in engagement with said exposed portions of said conductors for forming electrical circuits therewith, said conductors at the opposite ends thereof being in a substantially circular pattern, one of said sheets at said opposite ends of said conductors being recessed away from said opposite ends so that said opposite ends of said conductors are exposed on one side thereof, said opposite ends of said conductors having openings therethrough and having continuous walls around said openings, and a plurality of electrically conductive pins, said pins being in registry with said openings in said opposite ends of said conductors, said pins having tapered portions received in said openings, said exposed sides of said conductors being positioned adjacent and facing the base portions of said tapered portions, said conductors around said openings being deflected outwardly along said tapered portions for gripping the same and engaging said tapered portions with area contact for forming electrical circuits therewith, said continuous walls being in hoop tension and exerting compressive forces on said tapered portions.

13. A device as recited in claim 12 in which said clips are substantially U-shaped, each of said clips having an intermediate wall extending between one of said conductors and said edge portion of said one sheet.

each of said clips having a pair of sidewalls extending outwardly from said one sheet on either side of said conductor.

14. An electrical connector device comprising a duality of printed circuit tapes, each of said tapes including flexible sheet means of dielectric material, and a plurality of spaced thin, flat conductors carried by said sheet means, each of said conductors having two principal surfaces, an opening therethrough and a continuous wall around said opening, said sheet means having an opening therethrough in registry with each of said openings in said conductors, means holding said tapes substantially in parallelism, a plurality of pins of electrically conductive material, each of said pins having a duality of tapered portions disposed one adjacent either end thereof, each of said tapered portions having relatively wide portions and relatively narrow portions spaced therefrom, said tapered portions being received in said openings in said conductors and said sheet means of both of said tapes with said conductors positioned adjacent said relatively wide portions of said tapered portions and said sheet means positioned adjacent said relatively narrow portions of said tapered portions, and means engaging each of said tapes on opposite sides thereof in spaced adjacency with said openings in said conductors for providing relatively narrow annular parts of said continuous walls of said conductors unsupported around said openings therethrough, said relatively narrow annular parts of said continuous walls of said conductors being deflected outwardly by said tapered portions toward said relatively narrow portions thereof, one of said principal surfaces of each of said conductors overlying and having area contact with said tapered portion received in said opening thereof, said openings in said continuous walls of said conductors being enlarged by said tapered portions, said continuous walls being in hoop tension and exerting an inward compressive force on said tapered portions.

15. A solderless electrical connection comprising a member of dielectric material, a pin of electrically conductive material carried by said member of dielectric material, said pin having an outwardly tapered portion projecting from a surface of said member of dielectric material, a second member of electrically conductive material, said second member having an opening therein, and a surface adjacent said surface of said member of dielectric material, and a third member of electrically conductive material, said third member being relatively thin and deflectable, said third member having an opening therethrough and a continuous wall around said opening, said tapered portion of said pin extending through said opening through said third member and into said opening in said second member, said continuous wall of said third member adjacent said opening therethrough being deflected outwardly along said tapered portion so that said continuous wall is in hoop tension for forming an electrical connection therewith, said third member being forced against said second member by said tapered portion for forming an electrical connection with said second member, said surface of said member of dielectric material engaging said third member adjacent said opening therethrough and holding said third member against said surface of said second member.

16. A device as recited in claim 15 including in addition a board of dielectric material carrying said second member, said second member being part of a printed circuit on said board.

* * * * *